United States Patent
Priel et al.

(10) Patent No.: US 9,368,162 B2
(45) Date of Patent: Jun. 14, 2016

(54) INTEGRATED CIRCUIT DEVICE, POWER MANAGEMENT MODULE AND METHOD FOR PROVIDING POWER MANAGEMENT

(75) Inventors: Michael Priel, Netanya (IL); Dan Kuzmin, Givat Shmuel (IL); Sergey Sofer, Rishon Lezion (IL)

(73) Assignee: Freescale Semiconductor, Inc., Austin, TX (US)

( * ) Notice: Subject to any disclaimer, the term of this patent is extended or adjusted under 35 U.S.C. 154(b) by 158 days.

(21) Appl. No.: 13/983,145

(22) PCT Filed: Feb. 8, 2011

(86) PCT No.: PCT/IB2011/050525
§ 371 (c)(1),
(2), (4) Date: Aug. 1, 2013

(87) PCT Pub. No.: WO2012/107798
PCT Pub. Date: Aug. 16, 2012

(65) Prior Publication Data
US 2013/0308409 A1 Nov. 21, 2013

(51) Int. Cl.
*G11C 5/14* (2006.01)
*G06F 1/32* (2006.01)

(52) U.S. Cl.
CPC ............... *G11C 5/14* (2013.01); *G06F 1/3225* (2013.01); *G06F 1/3275* (2013.01); *Y02B 60/1228* (2013.01); *Y02B 60/32* (2013.01)

(58) Field of Classification Search
CPC ............... G11C 5/148; G11C 29/83; G11C 2207/2227; G11C 5/14; G06F 1/3225; G06F 1/3275; Y02B 60/1228; Y02B 60/32
USPC ............................................. 365/226, 185.09
See application file for complete search history.

(56) References Cited

U.S. PATENT DOCUMENTS

| | | | |
|---|---|---|---|
| 5,438,536 A * | 8/1995 | Salzman | 365/52 |
| 5,949,852 A * | 9/1999 | Duncan | H04M 1/6505 379/100.02 |
| 6,356,500 B1 * | 3/2002 | Cloud | G11C 5/14 365/226 |
| 6,917,555 B2 | 7/2005 | Bedwell et al. | |
| 7,181,188 B2 | 2/2007 | Vu et al. | |
| 7,237,131 B2 | 6/2007 | Kwa et al. | |
| 7,616,509 B2 | 11/2009 | Qureshi et al. | |
| 2003/0105932 A1 * | 6/2003 | David et al. | 711/167 |
| 2004/0196724 A1 * | 10/2004 | Chen et al. | 365/230.05 |
| 2006/0179334 A1 * | 8/2006 | Brittain et al. | 713/320 |
| 2008/0098243 A1 | 4/2008 | Saewong et al. | |
| 2009/0049312 A1 | 2/2009 | Min | |

(Continued)

FOREIGN PATENT DOCUMENTS

WO 2007/024435 A2 3/2007

OTHER PUBLICATIONS

Oxford Dictionaries, Definition of module, Apr. 4, 2015, http://www.oxforddictionaries.com/us/definition/american_english/module.*

(Continued)

*Primary Examiner* — Khamdan Alrobaie

(57) ABSTRACT

An integrated circuit device comprising at least one memory module comprising a plurality of memory sub-modules, and at least one power management module arranged to provide power management for the at least one memory module. The at least one power management module is arranged to determine when content of at least one memory sub-module is redundant, and place the at least one memory sub-module into a powered-down state upon determining that content of the at least one memory sub-module is redundant.

20 Claims, 7 Drawing Sheets

(56) References Cited

U.S. PATENT DOCUMENTS

2010/0100341 A1 4/2010 Kim et al.
2012/0182776 A1* 7/2012 Best et al. .................... 365/51

OTHER PUBLICATIONS

Oxford Dictionaries, Definition of redundant, Apr. 4, 2015, http://www.oxforddictionaries.com/us/definition/american_english/redundant.*

International Search Report and Written Opinion correlating to PCT/IB2011/050525 dated Dec. 19, 2011.

Flautner K, et al: "Drowsy Caches: Simple Techniques for Reducing Leakage Power", The Computer Society, Proceedings of the 29th Annual International Symposium on Computer Architecture (ISCA'02), 2002, pp. 148-157.

* cited by examiner

INTEGRATED CIRCUIT DEVICE, POWER MANAGEMENT MODULE AND METHOD FOR PROVIDING POWER MANAGEMENT

FIELD OF THE INVENTION

The field of this invention relates to an integrated circuit device, a power management module and a method for providing power management.

BACKGROUND OF THE INVENTION

In the field of modern integrated circuit devices, there is an increasing drive for the opportunity to use higher operating frequencies during high activity use-cases, and lower power consumption during low activity use-cases. In order to achieve the high operating frequencies during high activity use-cases, an integrated circuit device is required to be implemented using high operating frequency fabrication processes. However, such high frequency fabrication processes result in high power leakage of the bitcells, thereby making it difficult to achieve the required low power consumption during low activity use-cases.

For integrated circuit devices comprising applications that require access to data stored within external data storage devices, it is known to provide an on-die buffer into which data may be loaded during central processing unit (CPU) active periods. During subsequent CPU inactive periods, when the CPU and those components required for accessing the external data storage devices are powered-down, to reduce the power consumption of the integrated circuit device, the on-die buffer may remain powered-up to allow the loaded data to be accessed by other on-die modules. However, a problem with this known approach is that such on-die buffers have high power leakage, thereby limiting the reduction in power consumption that is achievable when they remain powered-up during CPU inactive periods.

SUMMARY OF THE INVENTION

The present invention provides an integrated circuit device, a power management module and a method for providing power management to at least one on-die memory module as described in the accompanying claims.

Specific embodiments of the invention are set forth in the dependent claims.

These and other aspects of the invention will be apparent from and elucidated with reference to the embodiments described hereinafter.

BRIEF DESCRIPTION OF THE DRAWINGS

Further details, aspects and embodiments of the invention will be described, by way of example only, with reference to the drawings. In the drawings, like reference numbers are used to identify like or functionally similar elements. Elements in the figures are illustrated for simplicity and clarity and have not necessarily been drawn to scale.

DETAILED DESCRIPTION

Examples of the present invention will now be described with reference to one simplified example of a signal processing architecture comprising an on-die memory module. However, it will be appreciated that the present invention is not limited to the specific signal processing architecture herein described with reference to the accompanying drawings, and may be equally applied to alternative architectures. For example, an integrated circuit device is described comprising a single on-die memory module. Alternatively, the present invention may be applied to integrated circuit devices comprising multiple on-die memory modules. Additionally, the present invention is herein described within reference to an on-die memory module comprising four sub-modules. However, it will be appreciated that the present invention may be equally applied to on-die memory modules comprising any number of sub-modules, for example two, eight, sixteen, etc. Furthermore, because the illustrated example embodiments of the present invention may for the most part, be implemented using electronic components and circuits known to those skilled in the art, details will not be explained in any greater extent than that considered necessary as illustrated below, for the understanding and appreciation of the underlying concepts of the present invention and in order not to obfuscate or distract from the teachings of the present invention.

Figure 1:
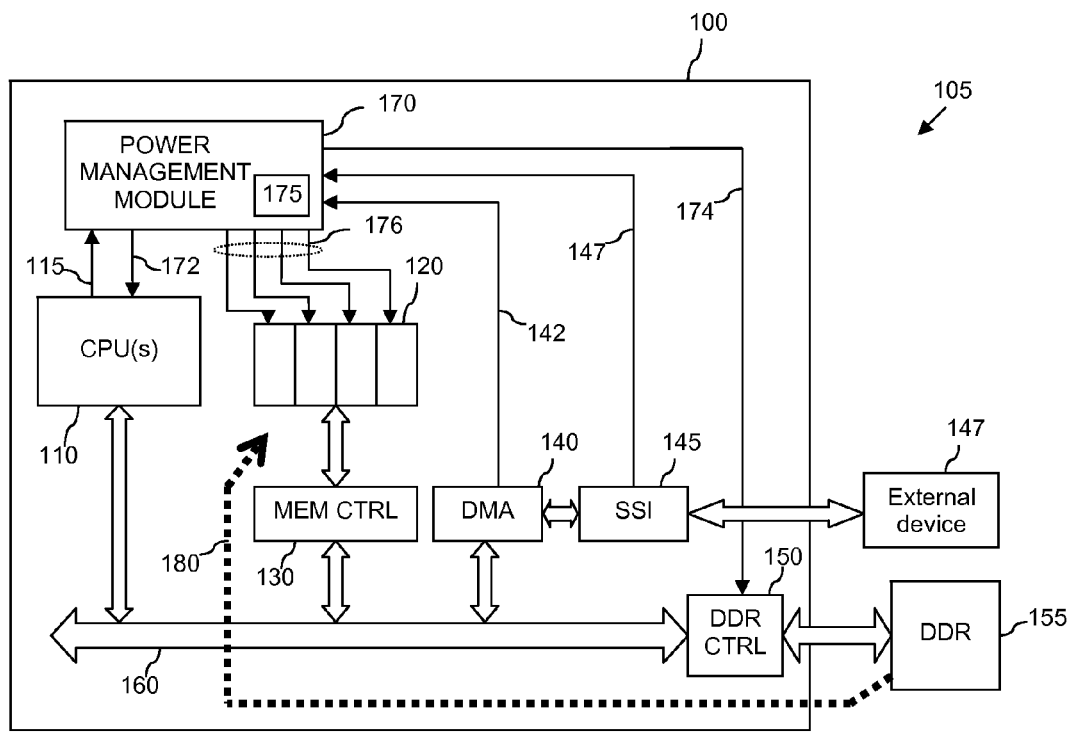
FIGS. 1 to 5 illustrate an example of power management within an integrated circuit device.

Referring first to FIG. 1 there is illustrated a simplified block diagram of an example of an integrated circuit device 100 comprising an example of a signal processing architecture 105 according to some embodiments of the present invention. The integrated circuit device 100 comprises one or more signal processing cores, which for the illustrated example is/are in the form of central processing units (CPUs) 110. The CPU(s) 110 is/are adapted to process data. The integrated circuit device 100 further comprises at least one memory module 120 into which data may be loaded and subsequently accessed by other on-die modules. An external data storage controller is also provided to enable one or more external data storage devices to be accessed. For the illustrated example, the external data storage controller comprises a DDR (Dual Data Rate) controller that is operably coupled to an external DDR data storage device 155, such as an external DDR SDRAM (Synchronous Dynamic Random Access Memory). In this manner, the DDR controller 150 enables data to be read from, and written to, the external data storage device 155. The integrated circuit device 100 is further provided with a data interconnect 160, for example which may comprise one or more data buses, crossover switches, etc. The data interconnect 160 operably couples on-die modules of the integrated circuit device 100, such as the CPU(s) 110, on-die memory module 120, DDR controller 150, etc., in order for data to be transferred there between. A memory controller 130 is provided between the on-die memory module 120 and the data interconnect 160 in order to control access to the memory module 120. The integrated circuit device 100 may comprise various other on-die modules, such as, by way of example only, a direct memory access (DMA) module 140, a synchronous serial interface (SSI) module 145, etc. A power management module 170 is also provided within the integrated circuit device 100, and arranged to control the supply of power to at least some of the on-die modules of the integrated circuit device 100. For example, the power management module 170 may be arranged to provide power control to, say, the CPU(s) 110, DDR controller 150 and the on-die memory module via power control signals 172, 174, 176 respectively. For the illustrated example, the power management module 170 is arranged to provide such power management at least partly in accordance with one or more control/configuration signals, illustrated generally at 115, received from the CPU(s) 110.

In accordance with conventional signal processing architectures, the power management module 170 may be arranged to power-down some of the on-die modules of the integrated circuit device 100 such as the CPU(s) 110, DDR controller 150, etc., during, say, periods of low CPU activity in order to reduce the overall power consumption thereof. During such CPU inactive periods, other on-die modules such as, say, the DMA module 140 and/or SSI module 145 may still require access to data, for example on behalf of one or more external devices, such as illustrated generally at 147.

Figure 2:
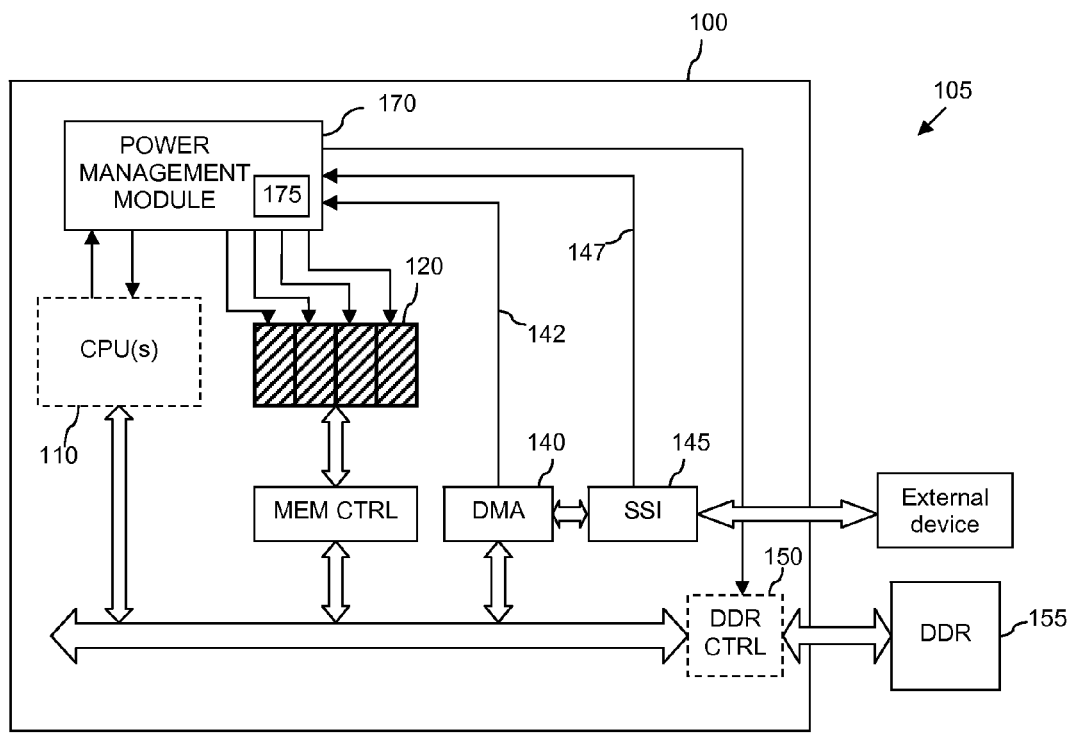

Accordingly, in some examples, such data may be loaded from, for example, the external data storage device 155 to the on-die memory module 120 during CPU active periods, as illustrated generally by arrow 180 in FIG. 1. During subsequent CPU inactive periods, such as illustrated in FIG. 2, when the CPU(s) 110 and DDR controller 150, etc are powered-down (powered-down (sub-)modules being illustrated with dashed lines in the drawings) to reduce the power consumption of the integrated circuit device 100, the on-die buffer may remain powered-up to retain the data loaded therein, and to allow the loaded data to be accessed by other on-die modules such as, for the illustrated example, the DMA module 140 and/or SSI module 145.

As previously identified, a problem with on-die buffers remaining powered-up is that they suffer from high power leakage, which limits the reduction in power consumption that is achievable when they remain powered-up during, for example, CPU inactive periods. For the example embodiment illustrated in FIG. 1, the on-die memory module 120 comprises a plurality of memory sub-modules that are capable of substantially independent power control. In addition, the power management module 170, which is arranged to provide power management for the memory module 120, is further arranged to determine dynamically when content of a memory sub-module of the on-die memory module 120 has become redundant (obsolete), and to put a memory sub-module into a powered-down state upon determining that content of said memory sub-module is redundant.

Content of a memory sub-module may be deemed redundant when such content is no longer required by an accessing module. For example, as data loaded into the on-die memory module 120 is accessed and used by an accessing module (e.g. the DMA module 140 or SSI module 145), the data within a sub-module of the memory module 120 may become redundant once the accessing module has accessed all the content of that sub-module and has moved on to access the content of another sub-module of the memory module 120.

In this manner, only those sub-modules of the on-die memory 120 containing, for example, content yet to be accessed and thus which is required to be retained, may be (at least partially) powered-up, whilst those sub-modules of the on-die memory 120 containing only redundant content may be powered-down. In this manner, the power consumption of the on-die memory element 120, and thereby of the integrated circuit device 100, may be significantly reduced, in particular during periods of CPU inactive periods.

Figure 3:
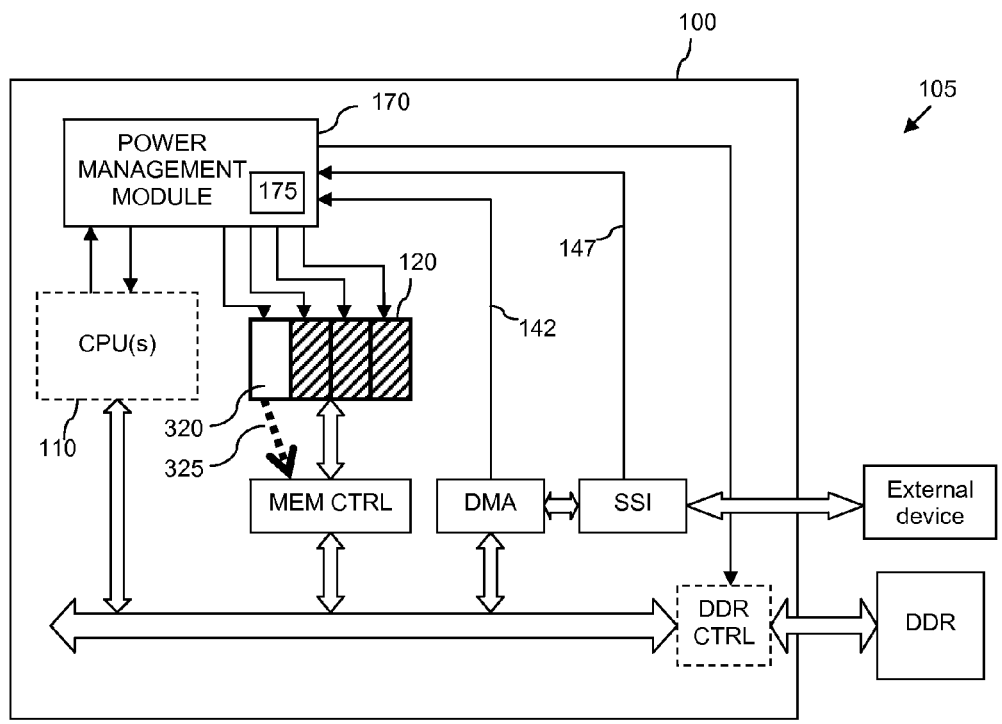
Figure 4:
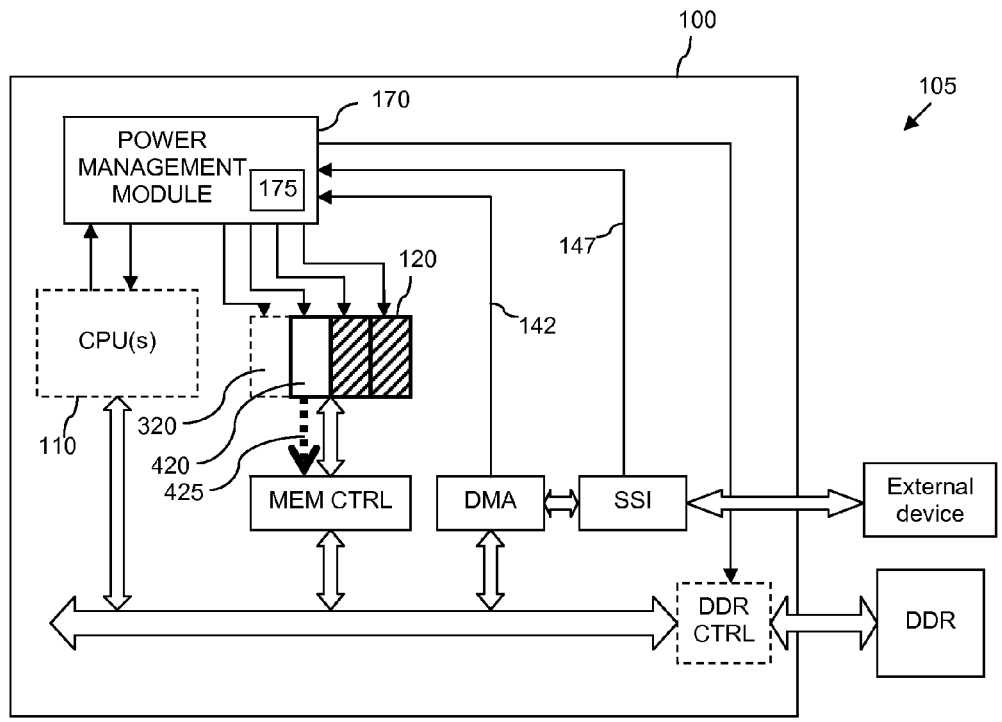
Figure 5:
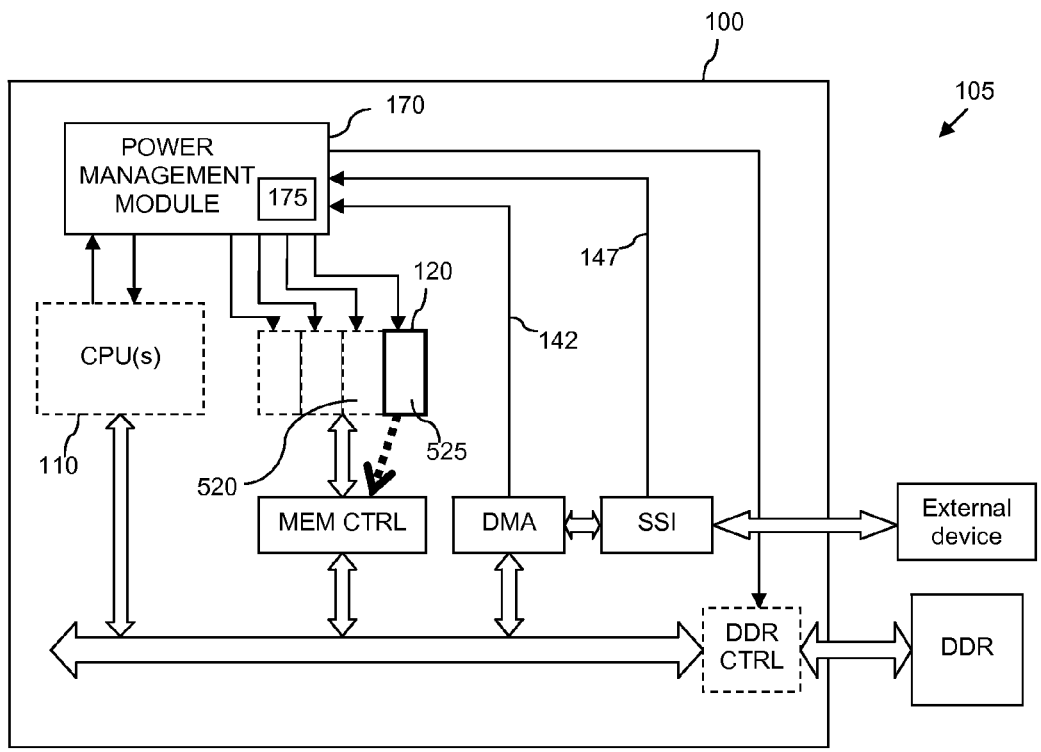

FIGS. 3 to 5 illustrate an example of such power management for the on-die memory module 120 according to some example embodiments of the present invention. For the illustrated example, data has been loaded sequentially into the on-die memory module 120, such that data is subsequently accessed sequentially from consecutive sub-modules of the memory module 120. In this manner, subsequent accessing of the loaded data may be substantially predictable. For example, the data loaded into the memory module 120 may comprise, say, audio or video data that is sequentially accessed in a substantially linear fashion, and provided (e.g. streamed) to, say, an audio or video codec (not shown) by the DMA module 140 or SSI module 145.

Referring now to FIG. 3, content of a first sub-module 320 of the memory module 120 may be initially accessed by loading the data sequentially into the on-die memory module 120, for example by the DMA module 140 or SSI module 145, as illustrated at 325. Once all the data has been accessed in the first sub-module 320, content of the next consecutive sub-module 420 (in FIG. 4) may then be accessed, as illustrated at 425. The content of the first sub-module 320 may thus be considered as being redundant and as such no longer required to be retained. In this example, the power management module 170 may be arranged to determine when content of a memory sub-module of the on-die memory module 120 is redundant, and to put such a memory sub-module into a powered-down state upon determining that content of said memory sub-module is redundant, for example by way of power control signals (e.g. power control signals 176 of FIG. 1), thereby reducing the power consumption of the on-die memory module 120.

Data usage timing is typically linear such that the time taken to access the entire content of a memory sub-module within the memory module 120 is substantially predictable. Accordingly, in some examples, the power management module 170 may be arranged to determine when content of a memory sub-module is redundant based at least partly on expiration of a timer, such as illustrated generally at 175. For example, the power management module 170 may be arranged to initialise the timer 175 upon, say, data being loaded into the on-die memory module 120. The timer 175 may be initialised to expire after a period of time that may be substantially equal to, say, a time taken to access the entire content of a memory sub-module of the on-die memory module 120. Accordingly, it can be assumed that the entire content of the first sub-module 320 has been accessed. Therefore, it may be determined that the content of the first sub-module 320 has become redundant, upon expiration of the timer. Thus, in this manner, the power management module 170 may power-down the first sub-module 320 upon this initial expiration of the timer 175, and the timer 175 then reset for the next sub-module 420. In this manner, and as illustrated in FIG. 5, the power management module 170 may sequentially put memory sub-modules 320, 420, 520 of the on-die memory module 120 into a powered-down state upon successive expirations of the timer 175. Upon expiration of the timer 175 for the final memory sub-module 525 of FIG. 5, the power management module 170 may be arranged to place the final memory sub-module 525 into a powered-down state (either independently or by way of powering-down the entire memory module 120). Additionally, the power management module 170 may be arranged to power up the CPU(s) 110, DDR controller 150 and all of the previously powered-down sub-modules 320, 420, 520 of the on-die memory module 120 in order for more data to be loaded into the on-die memory module 120.

For the illustrated example data has been loaded into the on-die memory module 120 sequentially such that data is subsequently accessed sequentially from consecutive sub-modules of the memory module 120, thereby enabling the subsequent accessing of the loaded data to be substantially predictable. In some examples, such sequential loading of data into the memory module 120 may be achieved within software, for example by way of instructions executed by the CPU(s) 110 to load the data from the external data storage device 155 to the on-die memory module 120.

The present invention is not limited to such sequential loading into, and subsequent sequential accessing of data from, consecutive sub-modules of the on-die memory module 120. For example, in some examples, data may be loaded into the on-die memory module 120 in any suitable manner that allows the power management module 170 to predict the accessing of data from sub-modules within the on-die memory module 120. For example, data may alternatively be accessed from the sub-modules of the on-die memory-module in a fixed and predefined (non-consecutive) order, and the power management module 170 may be arranged to sequentially place memory sub-modules of the on-die memory module 120 into a powered-down state upon successive expirations of the timer 175 in this fixed and predefined (non-consecutive) order. Alternatively still, in some examples, the power management module 170 may be configurable, for example by software executed by the CPU(s) 110, and to sequentially place memory sub-modules of the on-die memory module 120 into a powered-down state upon successive expirations of the timer 175 in accordance with a software configured order. In addition, in some examples, the timer 175 may be configurable, for example by software executed by the CPU(s) 110. In this manner, variations in the speed at which data is accessed may be compensated for.

In still further alternative examples of the present invention, in some examples, the power management module 170 may be additionally and/or alternatively arranged to determine when content of a memory sub-module 320, 420, 520, 525 is redundant based at least partly on receipt of one or more external signals. Such external signals may be provided by, say, a module accessing the data within the on-die memory module 120, such as the DMA module 140 and/or SSI module 145 via signal lines 142, 147 (of FIG. 1) for the illustrated example. Such an external signal 142, 147 may indicate events such as, say, the start of data being accessed from the memory module 120 and/or a sub-module 320, 420, 520, 525. In this manner, the power management module 170 may be arranged to initialise the timer 175 upon receipt of such an external signal 142, 147 indicating the start of data being accessed from the memory module 120 or a sub-module 320, 420, 520, 525 thereof, and to determine that the content of a corresponding sub-module has become redundant upon expiration of the timer 175. Additionally and/or alternatively, such an external signal 142, 147 may indicate events such as, say, a completion of data being accessed from the memory module 120 and/or a sub-module 320, 420, 520, 525. In this manner, the power management module 170 may be arranged to determine that the content of a corresponding sub-module 320, 420, 520, 525 has become redundant based (at least partly) upon receipt of such an external signal 142, 147. Accordingly, the power management module 170 may be arranged to sequentially put the memory sub-modules 320, 420, 520, 525 into a powered-down state upon receipt of successive external signals.

In still further alternative examples, the power management module 170 may be additionally and/or alternatively arranged to determine when content of a memory sub-module 320, 420, 520, 525 is redundant based at least partly on, say, a comparison of an address within the memory module 120 being accessed. For example, one or more address values may be associated with each sub-module 320, 420, 520, 525, and an address monitoring module (not shown) may be provided within the signal processing architecture 105 and arranged to compare addresses being accessed within the memory module 120 with the address values associated with the sub-modules 320, 420, 520, 525. Upon an address being accessed that matches one of the associated address values, it may be determined that the access to the associated sub-module 320, 420, 520, 525 has completed, and that the content of the associated sub-module 320, 420, 520, 525 has become redundant. Accordingly, the power management module 170 may be arranged to sequentially put the memory sub-modules 320, 420, 520, 525 into a powered-down state upon associated addresses being accessed. For example, the address monitoring module (not shown) may be arranged to provide a (external) signal to the power management module 170 each time one of the associated addresses is accessed.

In still further alternative examples, the power management module 170 may be additionally and/or alternatively arranged to determine when content of a memory sub-module 320, 420, 520, 525 is redundant based at least partly on, say, a number of accesses made to the memory sub-module. For example, an access counter module (not shown) may be provided within the signal processing architecture 105 and arranged to count the number of accesses to the memory module 120. Upon the number of accesses to the memory module 120 reaching a predefined (e.g. software configurable) number, it may be determined that access to a 'current' sub-module 320, 420, 520, 525 has completed, and that the content of the current sub-module 320, 420, 520, 525 has become redundant. Accordingly, the power management module 170 may be arranged to sequentially put the memory sub-modules 320, 420, 520, 525 into a powered-down state upon, say, consecutive counts of a predefined number of accesses to the memory module 120. For example, the access counter module (not shown) may be arranged to provide a (external) signal to the power management module 170 each time a number of accesses to the memory sub-module reaches a predefined number.

Figure 6:
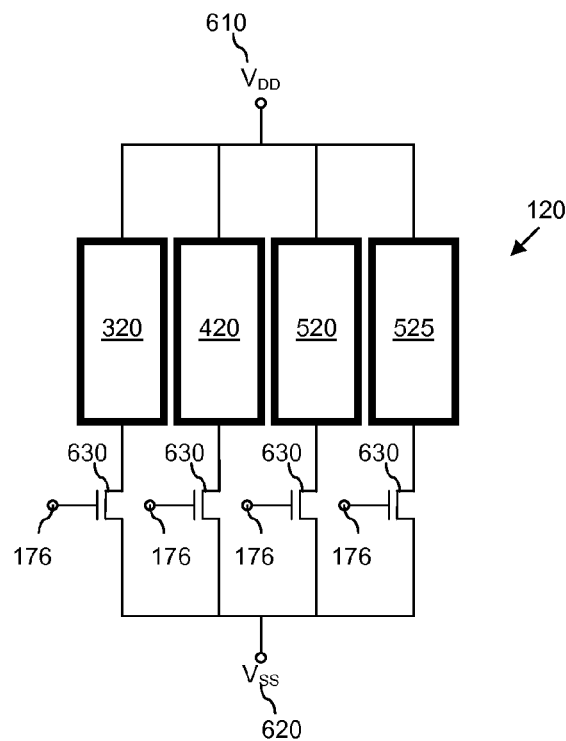
FIG. 6 illustrates a simplified example of an on-die low power arrangement of a memory module.

Referring to FIG. 6, there is illustrated an example of the on-die memory module 120. In accordance with some example embodiments, the power management module 170 may be arranged to place the memory sub-modules 320, 420, 520, 525 into a powered-down state by gating off a power supply thereto. Accordingly, as illustrated in FIG. 6, each sub-module 320, 420, 520, 525 of the on-die memory module 120 is operably coupled to at least one power or ground supply rail 610, 620 via a gating transistor 630. Each gating transistor 630 is controlled via one of the power control signals 176 applied to the gate terminal of the respective transistor 630. In this manner, the power management module 170 is selectively able to gate off power/ground to each individual sub-module 320, 420, 520, 525.

Referring back to FIG. 2, as previously mentioned the power management module 170 may be arranged to power-down some of the on-die modules of the integrated circuit device 100 such as the CPU(s) 110, DDR controller 150, etc. during, say, periods of low CPU activity in order to reduce the overall power consumption thereof. During subsequent CPU inactive periods, such as illustrated in FIG. 2, when the CPU(s) 110 and DDR controller 150, etc are powered-down, the on-die buffer may remain powered-up in order to retain the data loaded therein, and to allow the loaded data to be accessed by other on-die modules such as, for the illustrated example, the DMA module 140 and/or SSI module 145. The power management module 170 may be further arranged to determine when content of a memory sub-module of the on-die memory module 120 is redundant, and to place a memory sub-module into a powered-down state upon determining that content of said memory sub-module is redundant.

In some examples, there may be a significant time delay between loading data into the on-die memory module 120, and the content of at least some of the memory sub-modules being accessed. Accordingly, in some examples, a further reduction in the power consumption of the on-die memory module 120 may be achieved if those memory sub-modules that comprise content yet to be accessed (e.g. dormant content) may be placed into a low-power state (i.e. a state comprising sufficient power to retain data stored therein but which need not enable such content to be readily accessed).

Figure 7:
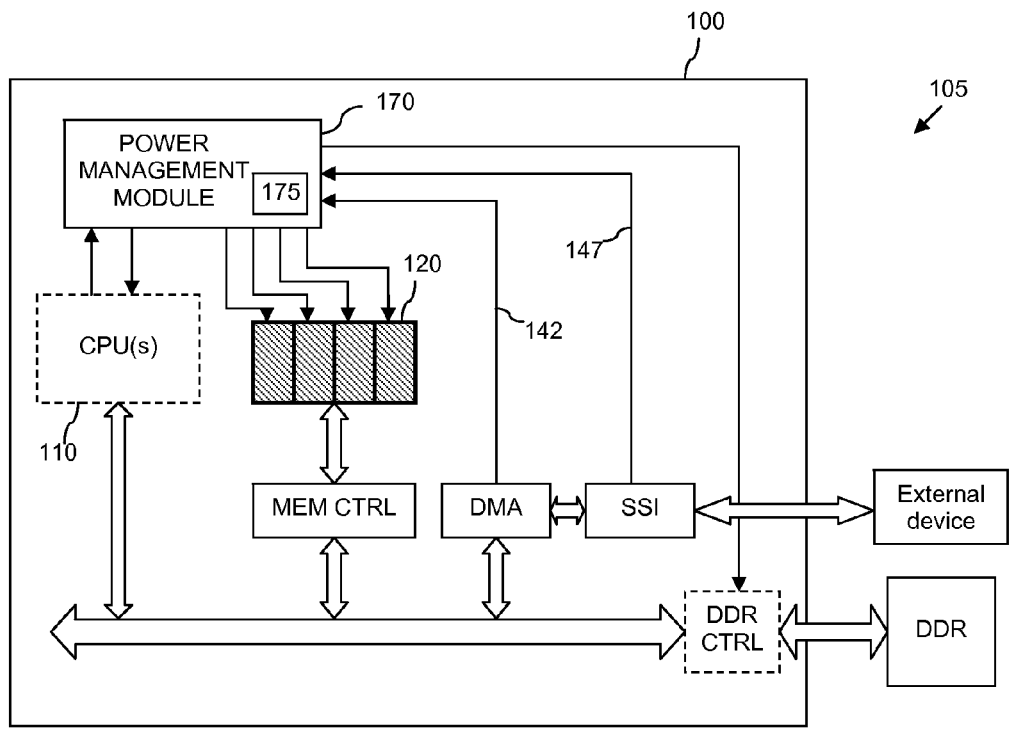
FIGS. 7 to 10 illustrate an alternative example of power management within an integrated circuit device.
Figure 8:
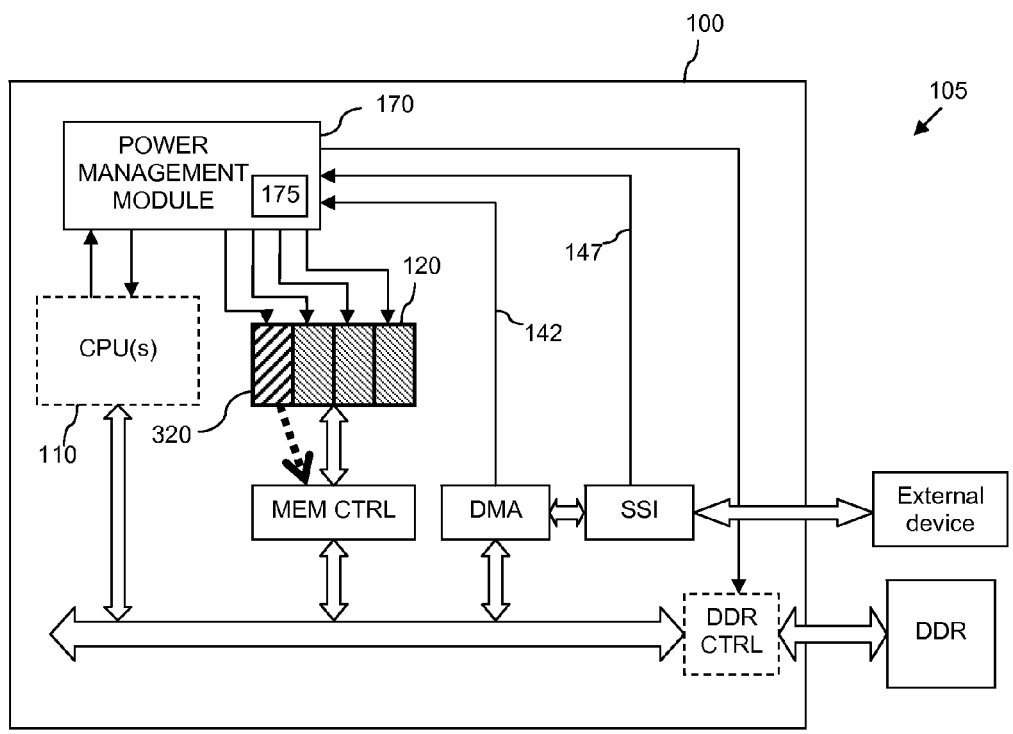

Thus, and in accordance with some further examples, the power management module 170 may be further arranged to put memory sub-modules of the on-die memory module 120 comprising 'dormant' content (e.g. content yet to be accessed) into a low-power ('drowsy') state. The content of a memory sub-module 320, 420, 520, 525 may be considered dormant if said content is not currently being accessed, and is required to be retained for expected future access(es). For example, and as illustrated in FIG. 7, the power management module 170 may be arranged to put all of the sub-modules of the on-die memory module 120 into a low-power (drowsy) state upon data being loaded into the on-die memory 120. The power management module 170 may be subsequently arranged to power-up ('wake-up') the first sub-module 320 of the on-die memory module 120 from a low-power state to a powered-up state to enable the content thereof to be accessed, as illustrated in FIG. 8. Such powering-up of the first sub-module 320 may be performed by the power management module 170 substantially immediately after placing the sub-modules into a low-power state. Alternatively, such powering-up of the first sub-module 320 may be performed in response to, say, expiration of the timer 175 or in response to an external signal, such as from the DMA module 140 and/or the SSI module 145 for the illustrated example.

Figure 9:
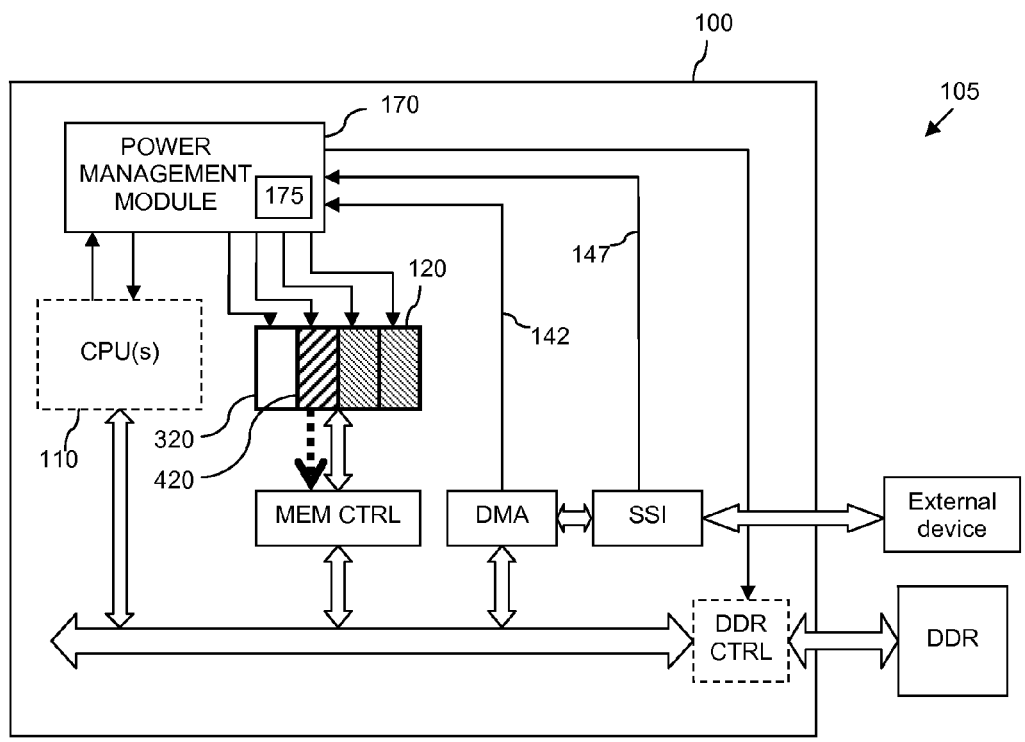

The power management module 170 may then be arranged to power-up the next sequential sub-module (which for the illustrated example comprises the next consecutive sub-module 420) of the on-die memory module 120 at around the time when accessing of the content of the first sub-module 320 completes, thereby enabling the content of the next sequential sub-module 420 to be subsequently accessed, as illustrated in FIG. 9. Such powering up of the next sequential sub-module may be performed in response to, say, expiration of the timer 175 or in response to an external signal, such as from the DMA module 140 and/or the SSI module 145 for the illustrated example. Thus, the power management module 170 may be arranged to sequentially power-up the remaining sub-modules 420, 520, 525 of the on-die memory 120 from a low-power state to a powered-up state, in response to, for example, successive expirations of the timer 175 and/or receipt of at least one external signal 142, 147.

Figure 10:
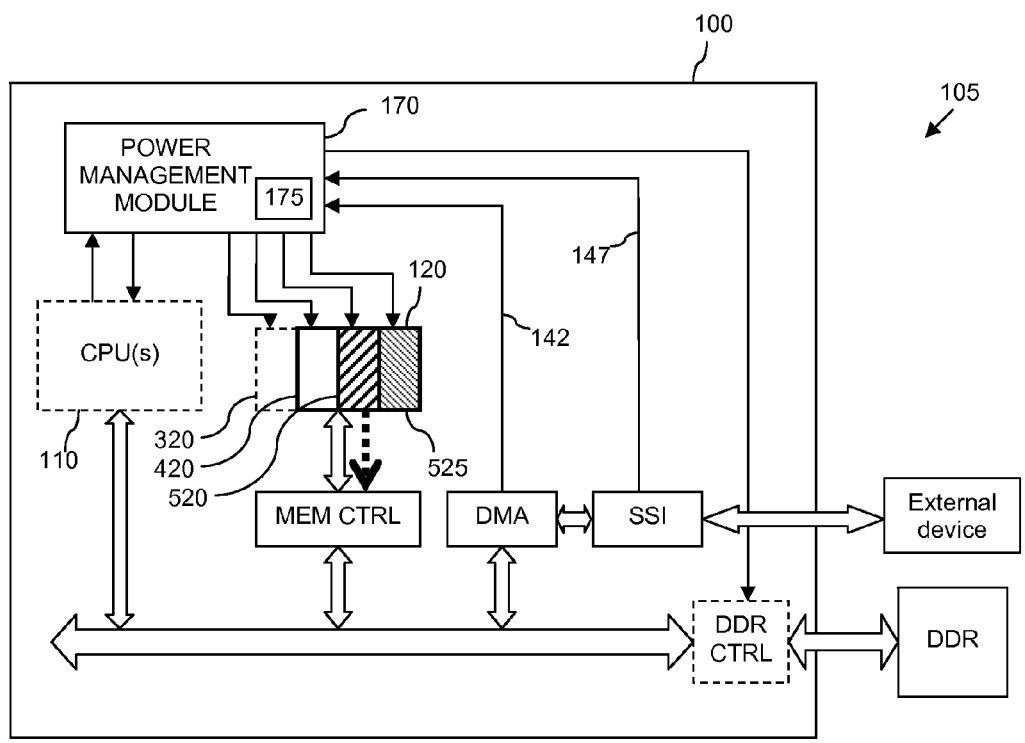

In particular, in some examples and in addition to the power management module 170 being arranged to place sub-modules of the on-die memory module 120 comprising dormant data into a low-power state, and subsequently to sequentially power-up the sub-modules in order for their content to be sequentially accessed, the power management module 170 may be substantially simultaneously arranged to place a previously accessed memory sub-module, the content of which has now become redundant, into a powered-down state, such as illustrated in FIG. 10 with the first sub-module 320. In this manner, the power management module 170 may initially place the sub-modules 320, 420, 520, 525 into a low-power state, whereby the data loaded therein is retained. Subsequently, the power management module 170 may sequentially power-up one or more sub-modules at a time to enable their data to be accessed, whilst substantially simultaneously powering-down sub-modules once their data has become redundant. Accordingly, only those 'active' sub-modules of the on-die memory module 120 (e.g. those for which content is currently being accessed) need be fully powered up. Those sub-modules comprising dormant content may be maintained in a low-power state, and those sub-modules comprising redundant content may be powered-down. Thus, the power consumption of the on-die memory module 120 may be significantly reduced by reducing the number of sub-modules that are fully powered-up at any one time.

In accordance with some examples, the power management module 170 may be arranged to power-down a 'just accessed' sub-module of the on-die memory module 120 (for example sub-module 320 in the illustrated example of FIG. 9), and to power-up a next sequential sub-module of the on-die memory module 120 (for example sub-module 420 in FIG. 9) in response to, for example, a single expiration of the timer 175 and/or receipt of a single external signal 142, 147.

Referring back to FIG. 6, the power management module 170 may also be arranged to place the memory sub-modules 320, 420, 520, 525 into a low-power state by partially gating off a power supply thereto. For example, the power supply 620 in FIG. 6 may be partially gated off to one of the sub-modules 320, 420, 520, 525 by increasing the voltage at the gate terminal of the respective gating transistor 630, in order to increase the resistance of the gating transistor 630, but not so much as to place the transistor 630 into a saturation mode.

By providing a power management module as hereinbefore described that is capable of determining when content of a memory sub-module is redundant, and arranged to place such a memory sub-module into a powered-down state upon determining that content of the memory sub-module is redundant, the power consumption of an on-die memory module may be significantly reduced. Indeed, since data usage timing is typically linear, a reduction in the power leakage of the on-die memory module may be substantially halved with sufficient resolution of sub-module division within the memory module. Additionally, by enabling the power management module to also place memory sub-modules into a low-power state when the memory sub-modules comprise dormant content, a further reduction in the power leakage of the on-die memory module may be achieved.

Figure 11:
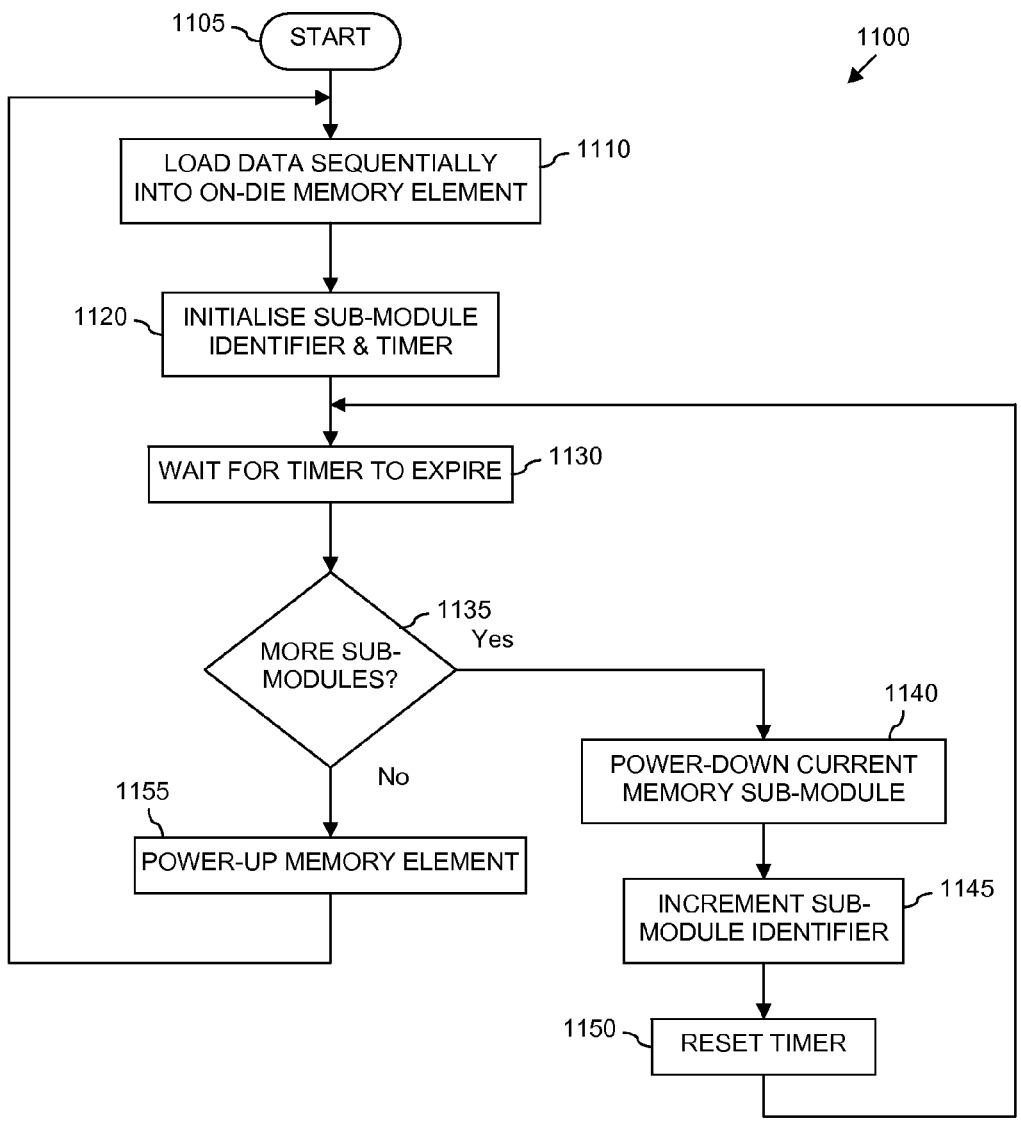
FIG. 11 illustrates a simplified flowchart of an example of a method for providing power management to at least one on-die memory module.

Referring now to FIG. 11, there is illustrated a simplified flowchart 1100 of an example of a method for providing power management to at least one on-die memory module, such as may be implemented by the power management module 170 of any of FIGS. 1 to 5 or FIGS. 7 to 10. The method starts at 1105, and moves on to 1110 where data is sequentially loaded into the on-die memory element. For example, the data may be loaded into the on-die memory module sequentially such that data is subsequently accessed sequentially from consecutive sub-modules of the memory module, thereby enabling the subsequent accessing of the loaded data to be substantially predictable. Alternatively, the data may be loaded into the on-die memory module such that data may be sequentially accessed from the sub-modules of the on-die memory-module in a fixed and predefined or software configured (non-consecutive) order. Next, at 1120, a timer and sub-module identifier are initialised. For example, the sub-module identifier may be initialised to identify a first sub-module to be accessed, and the timer (e.g. timer 175) may be initialised to expire after a period of time that is substantially equal to, say, a time taken to access the entire content of a sub-module of the on-die memory module. The method then waits for the timer to expire at 1130. Upon expiration of the timer, the method moves on to 1135 where it is determined whether (or not) the current sub-module is the last sub-module to be accessed, for example based on the sub-module identifier. If the current module is not the last sub-module to be accessed, the method moves on to 1140 where the current identified sub-module is powered down, which for the illustrated example comprises gating off power thereto. The sub-module identifier is then incremented at 1145 to identify the next sub-module to be accessed, and the timer reset at 1150. The method then loops back to 1130 where it waits for the timer to expire again. Conversely, if at 1135 it is determined that the current sub-module is the last sub-module to be accessed, the method moves on to 1155 where, for the illustrated example, the previously powered-down sub-modules of the on-die memory module are powered back up in order for more data to be loaded into the on-die memory module. The method then loops back to 1110.

Figure 12:
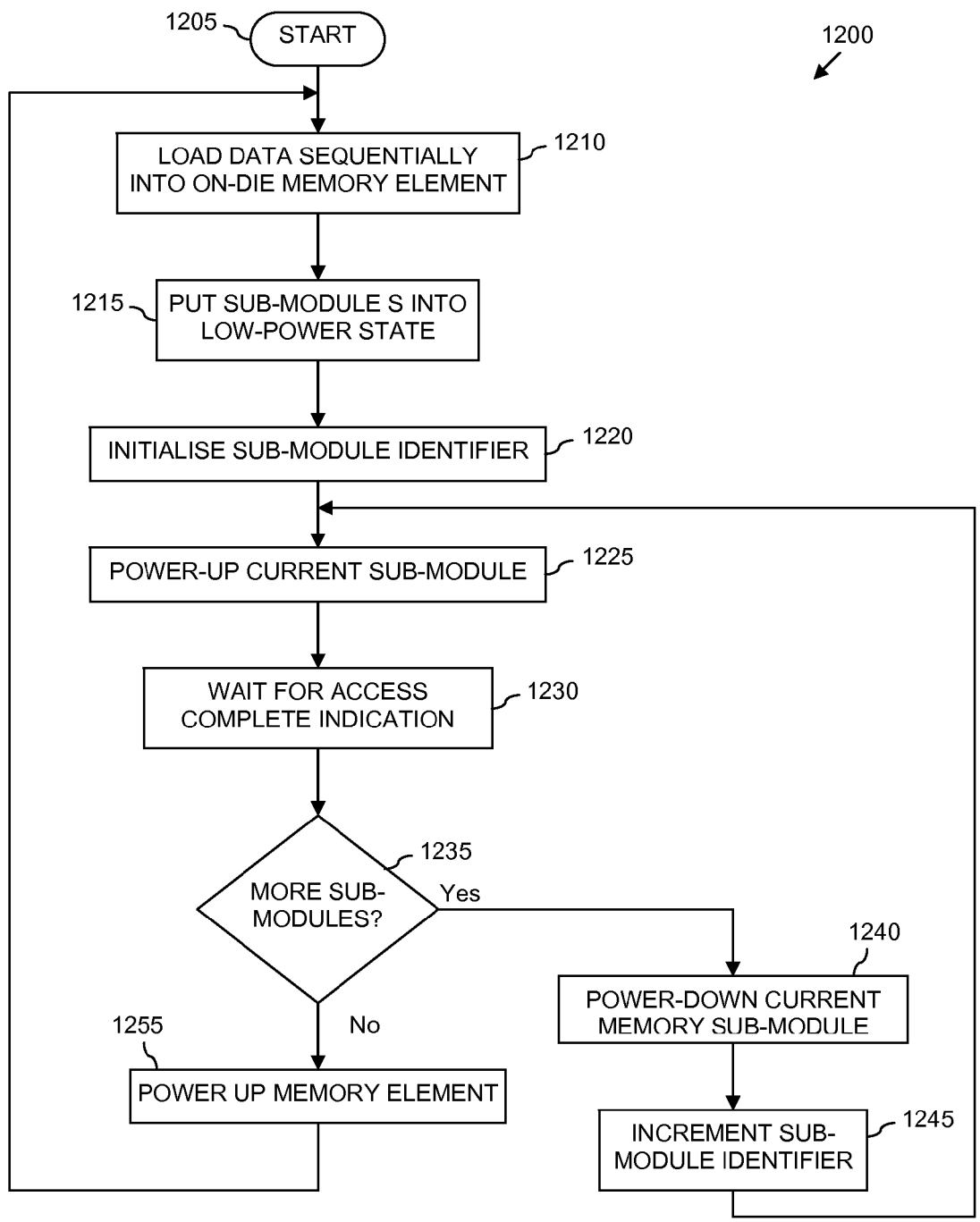
FIG. 12 illustrates a simplified flowchart of an alternative example of a method for providing power management to at least one on-die memory module.

Referring now to FIG. 12, there is illustrated a simplified flowchart 1200 of an alternative example of a method for providing power management to at least one on-die memory module, such as may alternatively be implemented by the power management module 170 of any of FIGS. 1 to 5 or FIGS. 7 to 10. The method starts at 1205, and moves on to 1210 where data is sequentially loaded into the on-die memory element. For example, data may be loaded into the on-die memory module sequentially such that data is subsequently accessed sequentially from consecutive sub-modules of the memory module, thereby enabling the subsequent accessing of the loaded data to be substantially predictable. Alternatively, the data may be loaded into the on-die memory module, such that data may be sequentially accessed from the sub-modules of the on-die memory-module in a fixed and predefined or software configured (non-consecutive) order. Next, at 1215, the sub-modules of the memory element are put into a low-power (drowsy) state (e.g. a state comprising sufficient power to retain data stored therein but which need not enable such content to be readily accessed). A sub-module identifier is the initialised, at 1220. For example, the sub-module identifier may be initialised to identify a first sub-module to be accessed. A first memory sub-module (e.g. corresponding to the sub-module identifier) is then powered-up at 1225 to enable the content thereof to be accessed. The method then waits for an indication that accessing of the content of the current memory sub-module has completed (for example by way of an external signal such as external signals 142, 142 from the DMA module 140 and/or SS module 145 of FIGS. 1 to 5 or FIGS. 7 to 10) at 1230. Upon receipt of an indication that accessing of the content of the current memory sub-module has completed, the method moves on to 1235 where it is determined whether or not the current sub-module is the last sub-module to be accessed, for example based on the sub-module identifier. If the current module is not the last sub-module to be accessed, the method moves on to 1240 where the current identified sub-module is powered down, which for the illustrated example comprises gating off power thereto. The sub-module identifier is then incremented at 1245 to identify the next sub-module to be accessed. The method then loops back to 1225 where the next memory sub-module (e.g. corresponding to the sub-module identifier) is then powered-up at 1225 to enable the content thereof to be accessed. The method then waits for an indication that accessing of the content of the current memory sub-module has completed. Conversely, if at 1235 it is determined that the current sub-module is the last sub-module to be accessed, the method moves on to 1255 where, for the illustrated example, the previously powered-down sub-modules of the on-die memory module are powered back up in order for more data to be loaded into the on-die memory module. The method then loops back to 1210.

Thus, the various example embodiments of the present invention, and in particular the example embodiments illustrated in FIGS. 6 to 10 and FIG. 12, provide a method of (up to) 3-level power management for a dynamically allocated on-die memory module, which enables memory sub-blocks to be placed into an appropriate power state, e.g. a low-powered (drowsy) state, a (fully) powered-up state or powered-down state, according to the state of their respective content, e.g. dormant, active (being accessed) or redundant. Accordingly, the power consumption of such an on-die memory module may be significantly reduced. Significantly, such a reduction in power consumption may be achieved (although not exclusively) during low activity periods, such as during CPU inactive periods where reduction in overall power consumption of the integrated circuit device is of particular concern.

At least parts of the invention may be implemented in a computer program for running on a computer system, at least including code portions for performing steps of a method according to the invention when run on a programmable apparatus, such as a computer system or enabling a programmable apparatus to perform functions of a device or system according to the invention.

A computer program is a list of instructions such as a particular application program and/or an operating system. The computer program may for instance include one or more of: a subroutine, a function, a procedure, an object method, an object implementation, an executable application, an applet, a servlet, a source code, an object code, a shared library/dynamic load library and/or other sequence of instructions designed for execution on a computer system.

The computer program may be stored internally on computer readable storage medium or transmitted to the computer system via a computer readable transmission medium. All or some of the computer program may be provided on computer readable media permanently, removably or remotely coupled to an information processing system. The computer readable media may include, for example and without limitation, any number of the following: magnetic storage media including disk and tape storage media; optical storage media such as compact disk media (e.g., CD-ROM, CD-R, etc.) and digital video disk storage media; non-volatile memory storage media including semiconductor-based memory units such as FLASH memory, EEPROM, EPROM, ROM; ferromagnetic digital memories; MRAM; volatile storage media including registers, buffers or caches, main memory, RAM, etc.; and data transmission media including computer networks, point-to-point telecommunication equipment, and carrier wave transmission media, just to name a few.

A computer process typically includes an executing (running) program or portion of a program, current program values and state information, and the resources used by the operating system to manage the execution of the process. An operating system (OS) is the software that manages the sharing of the resources of a computer and provides programmers with an interface used to access those resources. An operating system processes system data and user input, and responds by allocating and managing tasks and internal system resources as a service to users and programs of the system.

The computer system may for instance include at least one processing unit, associated memory and a number of input/output (I/O) devices. When executing the computer program, the computer system processes information according to the computer program and produces resultant output information via I/O devices.

In the foregoing specification, the invention has been described with reference to specific examples of embodiments of the invention. It will, however, be evident that various modifications and changes may be made therein without departing from the broader spirit and scope of the invention as set forth in the appended claims.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections.

For example, separate unidirectional connections may be used rather than bidirectional connections and vice versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Each signal described herein may be designed as positive or negative logic. In the case of a negative logic signal, the signal is active low where the logically true state corresponds to a logic level zero. In the case of a positive logic signal, the signal is active high where the logically true state corresponds to a logic level one. Note that any of the signals described herein can be designed as either negative or positive logic signals. Therefore, in alternate embodiments, those signals described as positive logic signals may be implemented as negative logic signals, and those signals described as negative logic signals may be implemented as positive logic signals.

Those skilled in the art will recognize that the boundaries between logic blocks are merely illustrative and that alternative embodiments may merge logic blocks or circuit elements or impose an alternate decomposition of functionality upon various logic blocks or circuit elements. Thus, it is to be understood that the architectures depicted herein are merely exemplary, and that in fact many other architectures can be implemented which achieve the same functionality. For example, for the illustrated examples, the power management module 170 has been illustrated and described as a single, standalone logic block for clarity and ease of description. However, it will be appreciated that the functionality provided by such a power management module 170 to implement the various features of the present invention may equally be distributed over a plurality of logic blocks. Furthermore, it is contemplated that some functionality of such a power management module 170 may be provided within other on-die modules of the integrated circuit device, for example within the CPU(s) 110, memory module 120, etc.

Any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or intermediary components. Likewise, any two components so associated can also be viewed as being "operably connected", or "operably coupled", to each other to achieve the desired functionality.

Furthermore, those skilled in the art will recognize that boundaries between the above described operations merely illustrative. The multiple operations may be combined into a single operation, a single operation may be distributed in additional operations and operations may be executed at least partially overlapping in time. Moreover, alternative embodiments may include multiple instances of a particular operation, and the order of operations may be altered in various other embodiments.

Also for example, the examples, or portions thereof, may implemented as soft or code representations of physical circuitry or of logical representations convertible into physical circuitry, such as in a hardware description language of any appropriate type.

Also, the invention is not limited to physical devices or units implemented in non-programmable hardware but can also be applied in programmable devices or units able to perform the desired device functions by operating in accordance with suitable program code, such as mainframes, minicomputers, servers, workstations, personal computers, notepads, personal digital assistants, electronic games, automotive and other embedded systems, cell phones and various other wireless devices, commonly denoted in this application as 'computer systems'.

However, other modifications, variations and alternatives are also possible. The specifications and drawings are, accordingly, to be regarded in an illustrative rather than in a restrictive sense.

In the claims, any reference signs placed between parentheses shall not be construed as limiting the claim. The word 'comprising' does not exclude the presence of other elements or steps then those listed in a claim. Furthermore, the terms "a" or "an", as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an". The same holds true for the use of definite articles. Unless stated otherwise, terms such as "first" and "second" are used to arbitrarily distinguish between the elements such terms describe. Thus, these terms are not necessarily intended to indicate temporal or other prioritization of such elements. The mere fact that certain measures are recited in mutually different claims does not indicate that a combination of these measures cannot be used to advantage.

The invention claimed is:

1. An integrated circuit device comprising:
    a central processing unit (CPU);
    at least one on-die buffer memory module operably coupled to the CPU, the at least one on-die buffer memory module comprising a plurality of memory sub-modules; and
    at least one power management module operably coupled to the on-die buffer memory module and configured to provide power management for the at least one on-die buffer memory module when the CPU is inactive;
    wherein the at least one power management module is configured to:
        dynamically determine when content of at least one memory sub-module has become redundant; and
        place the at least one memory sub-module into a powered-down state upon determining that content of the at least one memory sub-module is redundant.

2. The integrated circuit device of claim 1 further comprising:
   an on-die dual data rate (DDR) controller operably coupled to the CPU, wherein the at least one power management module is further configured to provide power management for the at least one on-die buffer memory module when the on-die DDR controller is inactive.

3. The integrated circuit device of claim 1 further comprising:
   an on-die memory controller operably coupled to the at least one on-die buffer memory module and to the DDR controller, wherein the on-die memory controller is configured to control access to the at least one on-die buffer memory module.

4. The integrated circuit device of claim 1 further comprising:
   an on-die direct memory access (DMA) module operably coupled to the CPU, wherein the at least one power management module is further configured to provide power management for the at least one on-die buffer memory module when the on-die DMA module is active.

5. The integrated circuit device of claim 4 further comprising:
   an on-die synchronous serial interface (SSI) operably coupled to the CPU, wherein the at least one power management module is further configured to provide power management for the at least one on-die buffer memory module when the on-die SSI is active.

6. The integrated circuit device of claim 1, wherein the at least one power management module is further configured to restore power to the CPU for more data to be loaded into the at least one on-die buffer memory module.

7. The integrated circuit device of claim 1, wherein the at least one power management module is further configured to provide independent power control for each of a plurality of a plurality of sub-modules the at least one on-die buffer memory module.

8. A power management module configured to provide power management for at least one on-die buffer memory module comprising a plurality of memory sub-modules when an on-die central processing unit (CPU) is inactive; the power management module being configured to:
   dynamically determine when content of at least one memory sub-module has become redundant; and
   place the at least one memory sub-module into a powered-down state upon determining that content of the at least one memory sub-module is redundant.

9. The power management module of claim 8 further configured to provide power management for the at least one on-die buffer memory module when an on-die dual data rate (DDR) controller is inactive.

10. The power management module of claim 8 wherein access to the at least one on-die buffer memory module is configured to be controlled by an on-die memory controller.

11. The power management module of claim 8, wherein the power management module is further configured to provide power management for the at least one on-die buffer memory module when an on-die direct memory access (DMA) module is active.

12. The power management module of claim 8, wherein the power management module is further configured to provide power management for the at least one on-die buffer memory module when an on-die synchronous serial interface (SSI) is active.

13. The power management module of claim 8, wherein the power management module is further configured to restore power to the CPU for more data to be loaded into the at least one on-die buffer memory module.

14. The power management module of claim 8, wherein the power management module is further configured to provide independent power control for each of a plurality of sub-modules of the at least one on-die buffer memory module.

15. A method for providing power management to at least one on-die buffer memory module when an on-die central processing unit (CPU) is inactive, the method comprising:
   dynamically determining when content of at least one memory sub-module of the on-die buffer memory module has become redundant; and
   placing the at least one memory sub-module into a powered-down state, upon determining that content of the at least one memory sub-module is redundant.

16. The method of claim 15, wherein the method is further for providing power management to at least one on-die buffer memory module when an on-die dual data rate (DDR) controller is inactive.

17. The method of claim 15, wherein the method is further for providing power management to at least one on-die buffer memory module when an on-die direct memory access (DMA) module is active.

18. The method of claim 15, wherein the method is further for providing power management to at least one on-die buffer memory module when an on-die synchronous serial interface (SSI) is active.

19. The method of claim 15, wherein the method further comprises:
   restoring power to the CPU for more data to be loaded into the at least one on-die buffer memory module.

20. The method of claim 15, wherein the power management is provided independently for each of a plurality of sub-modules of the at least one on-die buffer memory module.

* * * * *